United States Patent
Matsuyuki et al.

(10) Patent No.: US 9,864,116 B2
(45) Date of Patent: Jan. 9, 2018

(54) ELECTRONIC DEVICES HAVING INFRARED-TRANSPARENT WINDOW COATINGS

(71) Applicant: Apple Inc., Cupertino, CA (US)

(72) Inventors: Naoto Matsuyuki, Tokyo (JP); Mark T. Winkler, San Jose, CA (US); Matthew S. Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/231,170

(22) Filed: Aug. 8, 2016

(65) Prior Publication Data

US 2017/0184764 A1 Jun. 29, 2017

Related U.S. Application Data

(60) Provisional application No. 62/271,673, filed on Dec. 28, 2015.

(51) Int. Cl.

| G02B 5/20 | (2006.01) |
|---|---|
| H05K 5/00 | (2006.01) |
| H05K 5/03 | (2006.01) |
| G02B 1/115 | (2015.01) |
| G02B 5/28 | (2006.01) |
| G01V 8/10 | (2006.01) |
| G02B 5/22 | (2006.01) |

(52) U.S. Cl.
CPC ............ *G02B 5/208* (2013.01); *G01V 8/10* (2013.01); *G02B 1/115* (2013.01); *G02B 5/20* (2013.01); *G02B 5/22* (2013.01); *G02B 5/281* (2013.01); *H05K 5/0017* (2013.01); *H05K 5/03* (2013.01)

(58) Field of Classification Search
CPC . G02B 5/20; G02B 5/208; G02B 5/22; G02B 5/281; G02B 1/115; G01V 8/10; H05K 5/0017; H05K 5/03
USPC ........................................................ 359/885
See application file for complete search history.

(56) References Cited

U.S. PATENT DOCUMENTS

| 2005/0134959 A1* | 6/2005 | Simpson | B32B 17/10 359/359 |
| 2006/0154089 A1* | 7/2006 | Jung | B32B 17/10036 428/432 |
| 2008/0122803 A1* | 5/2008 | Izadi | G06F 3/0421 345/175 |

(Continued)

*Primary Examiner* — William R Alexander
(74) *Attorney, Agent, or Firm* — Treyz Law Group, P.C.; G. Victor Treyz; David K. Cole

(57) ABSTRACT

An electronic device may have a display with a cover layer. A light-based component such as an infrared-light proximity sensor or other infrared-light-based component may be aligned with a window in the display cover layer. The window may block visible light and transmit infrared light. A coating in the window may include a thin-film filter formed from a stack of inorganic dielectric layers. The thin-film filter may block visible light and transmit infrared light. The coating may also include at least one layer of material such as a semiconductor material that absorbs visible light and that passes infrared light. This material may be interposed between the thin-film filter and the display cover layer. Antireflection properties and color adjustment properties may be provided using thin-film layers between the thin-film filter and the display cover layer.

23 Claims, 8 Drawing Sheets

(56) References Cited

U.S. PATENT DOCUMENTS

| | | | |
|---|---|---|---|
| 2009/0135167 A1* | 5/2009 | Sakai | G02F 1/13318 |
| | | | 345/207 |
| 2012/0129579 A1* | 5/2012 | Tam | G01J 5/0025 |
| | | | 455/575.1 |
| 2012/0170284 A1* | 7/2012 | Shedletsky | G02F 1/13318 |
| | | | 362/355 |
| 2012/0243091 A1* | 9/2012 | Amm | G06F 1/1605 |
| | | | 359/489.07 |
| 2013/0048837 A1* | 2/2013 | Pope | G01J 1/0422 |
| | | | 250/214.1 |
| 2013/0063910 A1 | 3/2013 | Miyaguchi et al. | |
| 2013/0076712 A1 | 3/2013 | Zheng et al. | |
| 2013/0176512 A1* | 7/2013 | Posner | G02F 1/1333 |
| | | | 349/33 |
| 2014/0001588 A1* | 1/2014 | Sun | H01L 27/14621 |
| | | | 257/432 |
| 2014/0152632 A1 | 6/2014 | Shedletsky et al. | |
| 2014/0176615 A1 | 6/2014 | Avci et al. | |
| 2014/0252213 A1* | 9/2014 | Ruh | H01L 31/125 |
| | | | 250/227.11 |
| 2015/0303244 A1 | 10/2015 | de Jong et al. | |
| 2016/0054175 A1 | 2/2016 | Jia et al. | |
| 2016/0146992 A1* | 5/2016 | Thorstenson | G02B 5/281 |
| | | | 359/356 |

* cited by examiner

| P1 | | |
|---|---|---|
| Layer | Material | Thickness (nm) |
| 1 | Si₃N₄ | 17.1 |
| 2 | SiO₂ | 32.9 |
| 3 | Si₃N₄ | 67.3 |
| 4 | CuO | 266.8 |
| 5 | Si₃N₄ | 124.2 |
| 6 | SiO₂ | 149.0 |
| 7 | Si₃N₄ | 91.0 |
| 8 | SiO₂ | 119.8 |
| 9 | Si₃N₄ | 75.7 |
| 10 | SiO₂ | 114.7 |
| 11 | Si₃N₄ | 85.8 |
| 12 | SiO₂ | 127.4 |
| 13 | Si₃N₄ | 95.3 |
| 14 | SiO₂ | 193.7 |

FIG. 7

| P2 | | |
|---|---|---|
| Layer | Material | Thickness (nm) |
| 1 | SiO₂ | 152.6 |
| 2 | Si₃N₄ | 9.6 |
| 3 | SiO₂ | 59.0 |
| 4 | Si₃N₄ | 20.4 |
| 5 | SiO₂ | 23.9 |
| 6 | Si₃N₄ | 53.7 |
| 7 | CuO | 134.6 |
| 8 | Si₃N₄ | 171.7 |
| 9 | SiO₂ | 74.2 |
| 10 | Si₃N₄ | 88.4 |
| 11 | SiO₂ | 119.1 |
| 12 | Si₃N₄ | 87.7 |
| 13 | SiO₂ | 172.6 |
| 14 | Si₃N₄ | 24.5 |
| 15 | SiO₂ | 178.2 |
| 16 | Si₃N₄ | 98.4 |
| 17 | SiO₂ | 195.3 |

FIG. 8

| P3 | | |
|---|---|---|
| Layer | Material | Thickness (nm) |
| 1 | CuO | 8.0 |
| 2 | SiO₂ | 59.0 |
| 3 | CuO | 22.3 |
| 4 | SiO₂ | 33.9 |
| 5 | CuO | 281.8 |
| 6 | Si₃N₄ | 138.4 |
| 7 | SiO₂ | 128.4 |
| 8 | Si₃N₄ | 90.9 |
| 9 | SiO₂ | 125.0 |
| 10 | Si₃N₄ | 78.7 |
| 11 | SiO₂ | 112.4 |
| 12 | Si₃N₄ | 86.8 |
| 13 | SiO₂ | 134.9 |
| 14 | Si₃N₄ | 89.6 |
| 15 | SiO₂ | 205.7 |

FIG. 9

ELECTRONIC DEVICES HAVING INFRARED-TRANSPARENT WINDOW COATINGS

This application claims the benefit of provisional patent application No. 62/271,673, filed Dec. 28, 2015, which is hereby incorporated by reference herein in its entirety.

FIELD

This relates generally to electronic devices and, more particularly, to electronic device window coatings that are visibly opaque and transparent at infrared wavelengths.

BACKGROUND

Electronic devices often contain displays. A display may have an active area with pixels that display images for a user and an inactive area running along the edge of the active area. A layer of glass may serve as a protective display cover layer. The layer of glass may overlap the active area and the inactive area. To hide internal components from view, the inner surface of the inactive area may be covered with an opaque masking layer such as a layer of black or white ink. Windows in the display cover layer may be formed from openings in the opaque masking layer. Light-sensitive components may be aligned with the windows. For example, an infrared proximity sensor may be aligned with a window in a display.

Infrared proximity detectors may contain light emitters such as light-emitting diodes that emit infrared light. Some of the emitted infrared light may be reflected off of external objects in the vicinity of an electronic device. A light detector in an infrared proximity detector may measure the reflected infrared light to produce a proximity sensor output signal. The magnitude of the proximity sensor output signal is indicative of whether or not an external object is located in close proximity to the electronic device.

To hide an infrared proximity sensor from view, a coating layer may be used to coat a window aligned with the proximity sensor. The coating layer may be formed from a printed ink layer that is transparent at infrared wavelengths. The printed ink, which may sometimes be referred to as infrared ink, may be opaque at visible wavelengths and may have a black appearance that approximates the appearance of the opaque masking layer in the inactive area or other suitable appearance.

Although use of a printed black infrared ink to cover a proximity sensor window may help improve the outward appearance of the electronic device, printed ink coatings may have rough surfaces and other light-scattering features. As a result, printed ink coatings may scatter light emitted by infrared light-emitting diodes in proximity sensors. The scattered light can lead to crosstalk from undesired back reflections from the display cover layer. The outwards appearance of the infrared ink may also not be well matched to the surrounding black ink in the inactive area of the display.

SUMMARY

An electronic device may have a display. The electronic device may have a transparent structure such as a transparent display cover layer for the display. A light-based component such as an infrared-light proximity sensor or other infrared-light-based component may be aligned with a window in the display cover layer.

The window may block visible light and transmit infrared light. A coating in the window may include a thin-film filter formed from a stack of inorganic dielectric layers. The thin-film filter may block visible light and transmit infrared light.

The coating may also include at least one layer of material such as a semiconductor material that absorbs visible light and that passes infrared light. This material may be interposed between the thin-film filter and the display cover layer.

Antireflection properties and color adjustment properties may be provided using thin-film layers between the thin-film filter and the display cover layer. Visible-light absorbing material may be incorporated into the thin-film layers.

BRIEF DESCRIPTION OF THE DRAWINGS

FIGS. 7, 8, and 9 are cross-sectional side views of illustrative stacks of layers that may be used in forming window coatings in accordance with embodiments.

DETAILED DESCRIPTION

Electronic devices may be provided with displays. An active area of the display contains an array of pixels that is used to display images. An inactive area of the display is free of pixels. Circuitry and internal device components may be mounted under the inactive area.

A protective display cover layer for the display may be formed from a layer of transparent material. The display cover layer may overlap both the active area and the inactive area of the display. A portion of the display cover layer that overlaps the active area is free of ink and is transparent. An inner surface of the portion of the display cover layer that overlaps the inactive area may be coated with an opaque masking layer to help hide internal structures in the device from view by a user. The opaque masking layer may be formed from a polymer with light absorbing particles. The opaque masking layer may be, for example, a layer of black ink or an opaque layer of another color.

Openings may be formed in the opaque masking layer to form light-transmitting windows. These windows, which may sometimes be referred to as optical windows or light windows, may be used to accommodate light-based components. For example, a camera may capture images through a window in a display cover layer, an ambient light sensor may make measurements of ambient light levels through a window in the display cover layer, and a light-based proximity sensor such as an infrared proximity sensor may be used to make proximity sensor measurements though a window in the display cover layer. In some situations (e.g., when forming windows for components such as cameras that operate at visible light wavelengths), the windows may be transparent at visible wavelengths. In other situations, such as when forming a window for an infrared proximity sensor, it may be desirable for a window to block visible light while transmitting infrared light. This allows the appearance of the window to blend in with the appearance of nearby portions of the opaque masking layer.

To ensure that a window coating has a desired appearance (e.g., a desired reflectivity, a desired color, a desired transmission at certain wavelengths, etc.), window coatings may be formed using thin-film stacks. For example, multiple thin layers of inorganic material may be deposited onto the inner surface of a display cover layer using physical vapor deposition techniques or other suitable techniques. By tuning the number of layers, the thicknesses of the layers, and the materials used in the layers of a coating, the coating can be provided with a desired external appearance and transmission properties. Coating layers that overlap windows of the type used for infrared light components such as infrared proximity sensors or infrared cameras may sometimes be described herein as an example.

Figure 1:
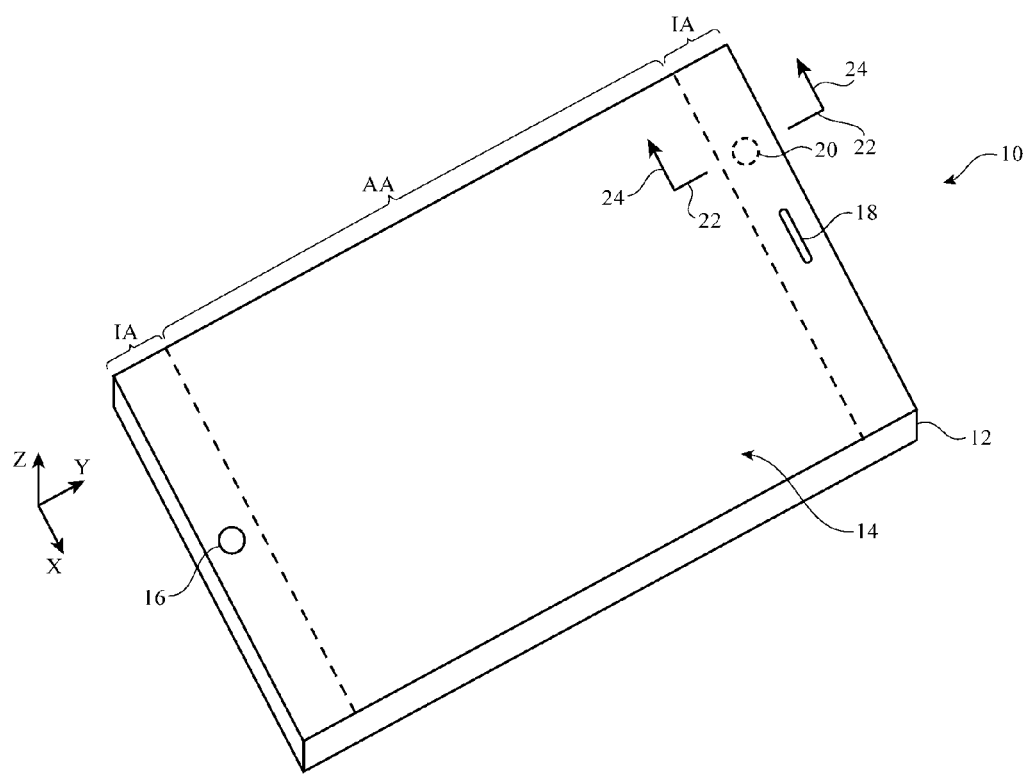
FIG. 1 is a perspective view of an illustrative electronic device in accordance with an embodiment.

FIG. 1 is a perspective view of an illustrative electronic device of the type that may include a display with windows for light-based components such as infrared-light components. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes display 14. Display 14 has been mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 14 may have an active area AA that includes an array of pixels. The array of pixels may be formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edges with a portion that is bent out of the plane of the planar main area, or other suitable shape. Openings may be formed in the display cover layer to accommodate button 16, ports such as speaker port 18, and other structures.

Display 14 may have an inactive border region such as inactive area IA that runs along one or more of the edges of active area AA. Inactive area IA may be free of pixels for displaying images and may overlap circuitry and other internal device structures in housing 12. To block these structures from view by a user of device 10, the underside of the display cover layer for display 14 may be coated with an opaque masking layer in inactive area IA. The opaque masking layer may have any suitable color. With one suitable arrangement, which may sometimes be described herein as an example, the opaque masking layer in regions IA of display 14 may be formed from a layer of black ink that is opaque at visible wavelengths and infrared wavelengths.

Openings may be formed in the black ink coating on the underside of the display cover layer in inactive area IA. These openings may form windows for light-based components in device 10. In the example of FIG. 1, window 20 has been formed in inactive area IA along an upper edge of display 14. In general, windows such as window 20 may be formed in any suitable portion of display 14 (i.e., in other portions of inactive area IA) or other transparent structures in device 10. The configuration of FIG. 1 is merely illustrative.

Window 20 may have a coating that allows infrared light to be transmitted through window 20. The coating may have an opaque appearance that matches the appearance of surrounding portions of the black ink layer covering the underside of the display cover layer in inactive area IA. This may help obscure window 20 and enhance the aesthetics of device 10. The infrared transparency of window 20 may allow window 20 to be used as a window for an infrared-light component such as an infrared camera, an infrared light detector, or an infrared proximity sensor that contains an infrared light-emitting diode and an infrared light detector. Configurations in which window 20 is used as an infrared transparent window for an infrared proximity sensor may sometimes be described herein as an example.

Figure 2:
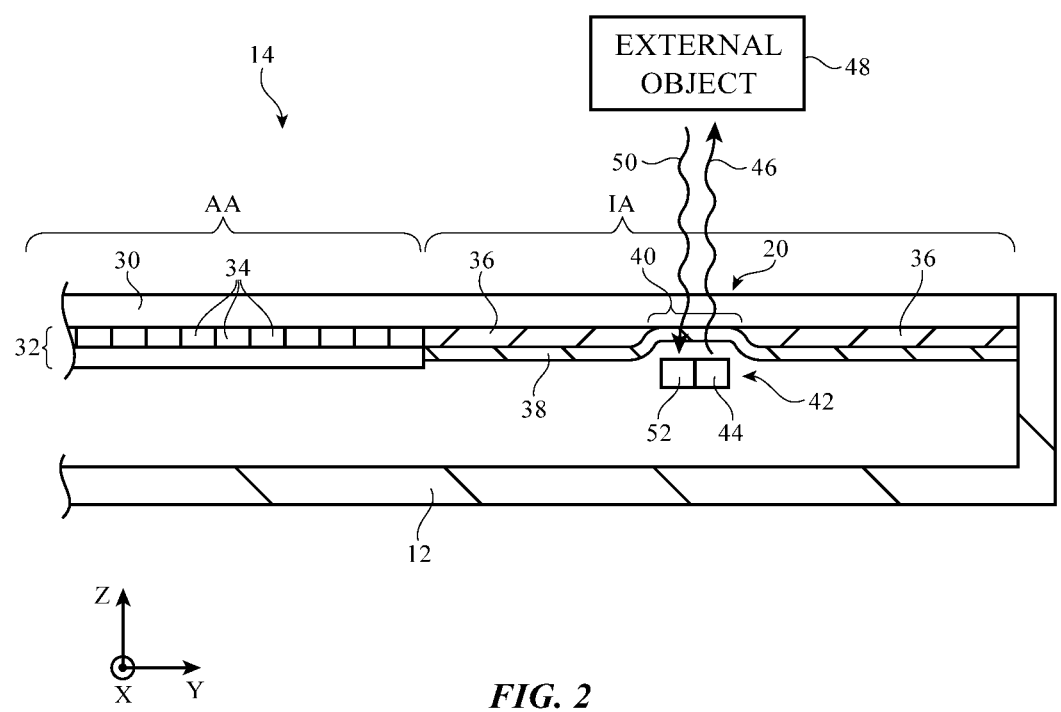
FIG. 2 is a cross-sectional side view of a portion of an illustrative electronic device with a window coated with a coating that is opaque at visible wavelengths and transparent at infrared wavelengths in accordance with an embodiment.

FIG. 2 is a cross-sectional side view of a portion of device 10 of FIG. 1 in the vicinity of window 20 taken along line 22 of FIG. 1 and viewed in direction 24. As shown in FIG. 2, display 14 may have a transparent layer such as display cover layer 30. Display cover layer 30 may be formed from a transparent material such as glass, plastic, sapphire or other crystalline material, transparent ceramic, etc. In active area AA, display 14 may contain structures 32 (e.g., an organic light-emitting diode display layer, a liquid crystal display module, etc.) with an array of pixels 34 for displaying images.

The inner surface of display cover layer 30 may be coated with one or more layers of material in inactive area IA. In the example of FIG. 2, the underside of display cover layer 30 in inactive area IA has been coated with opaque masking layer 36. Opaque masking layer 36 may be, for example, a layer of black ink that absorbs light in visible and infrared wavelengths. Opening 40 for window 20 may be formed in opaque masking layer 36. Coating layer 38 may overlap opening 40 and may provide window 20 with a desired appearance. For example, coating layer 38 may include antireflection structures for suppressing reflections from window 20, thin-film spectral tuning structures for adjusting the color of window 20, and structures for blocking visible light while allowing infrared light to pass.

As shown in FIG. 2, an infrared-light component such as component 42 may be aligned with window 20 and may transmit and/or receive infrared light through window 20. In the illustrative example of FIG. 2, component 42 is an infrared light proximity sensor. Infrared light emitter 44 may be an infrared light-emitting diode that emits light 46 at near-infrared wavelengths of about 940-950 nm or other suitable infrared wavelengths. Coating 38 is preferably formed using physical vapor deposition layers or other thin-film structures that have smooth surfaces and are otherwise constructed to suppress undesired light scattering. This allows light 46 to exit window 20 without being excessively scattered (which could lead to crosstalk in sensor 42).

In the presence of an external object such as object 48 (e.g., a user's body, etc.), some of light 46 will be reflected towards window 20 as reflected infrared light 50. Reflected infrared light 50 that passes through window 20 may be detected using infrared light sensor 52 in infrared proximity sensor 42. The amount of light 50 that is measured by detector (sensor) 52 is indicative of whether or not external object 48 is in the vicinity of device 10.

Figure 3:
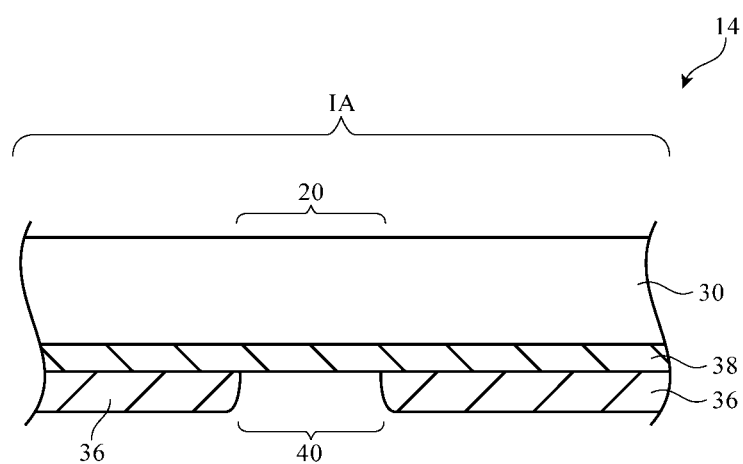
FIG. 3 is a cross-sectional side view of a portion of a display in which a coating that is opaque at visible wavelengths and transparent at infrared wavelengths is interposed between an opaque masking layer and a display cover layer and overlaps a window in accordance with an embodiment.

In the example of FIG. 2, window coating 38 has been deposited over the inner surface of opaque masking layer 36 after opening 40 has been formed in layer 36. If desired, coating 38 may be deposited on the inner surface of display cover layer 30 before depositing layer 36 and patterning layer 36 to form opening 40 for window 20 (see, e.g., FIG. 3). In configurations in which coating 38 has a sufficiently opaque appearance at visible wavelengths, some or all of opaque masking layer 36 may be omitted from inactive area IA.

Figure 4:
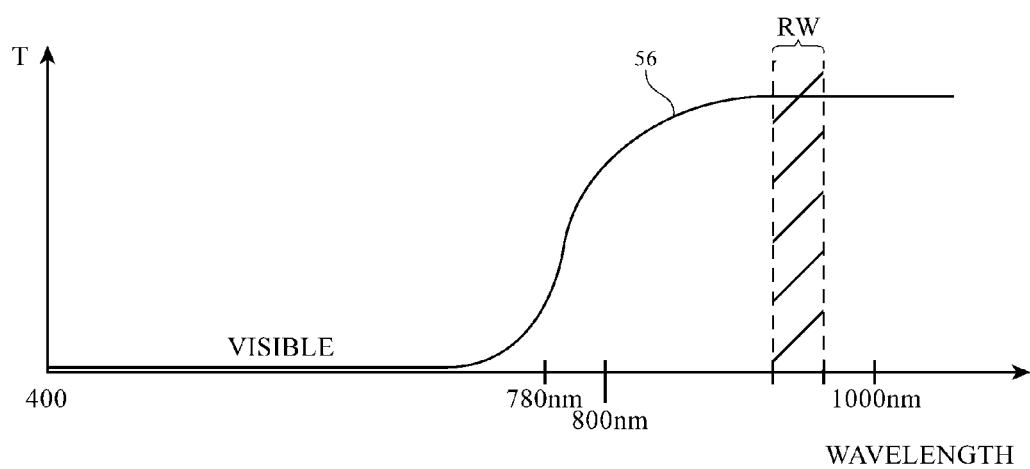
FIG. 4 is a graph in which light transmission has been plotted as a function of wavelength for an illustrative electronic device window coated with an infrared transparent coating that blocks visible light in accordance with an embodiment.

Coating 38 preferably does not reflect visible light (e.g., coating 38 may absorb visible light) so as to match the black appearance of opaque masking layer 36 and preferably transmits infrared light to allow infrared proximity sensor 42 to operate satisfactorily. A graph in which the transmission T of an illustrative coating such as coating 38 has been plotted as a function of wavelength is shown in FIG. 4. As illustrative transmission curve 56 of FIG. 4 illustrates, the transmission of coating 38 may be relatively high (e.g., greater than 70%, greater than 80%, greater than 90%, or greater than 95%) at wavelengths in proximity sensor operating range RW (e.g., at near infrared wavelengths of 940-950 nm) or other operating range for infrared component 42. At visible light wavelengths, the transmission of coating 38 may be low (e.g., less than 20%, less than 10%, or less than 5%) and the reflection of coating 38 may be low (e.g., less than 20%, less than 10%, or less than 5%).

Low visible light transmission and elevated infrared transmission may be achieved while ensuring that coating 38 has a desired appearance from the outside of device 10 using a stack of thin-film layers. The thin-film layers may include semiconductor layers, dielectric layers (e.g., inorganic layers and/or organic layers), metal layers, and/or other layers of material. These thin-film layers may be deposited using physical vapor deposition and other thin-film deposition techniques. The thickness of the deposited layers may be, for example, 1-500 nm, 5-300 nm, less than 100 nm, less than 500 nm, less than 50 nm, greater than 0.5 nm, or other suitable thickness. By using thin-film layers such as these, scattering and optical cross talk can be reduced. For example, less than 20%, less than 10%, less than 5%, or less than 2% of light incident on coating 38 may be scattered off axis.

Figure 5:
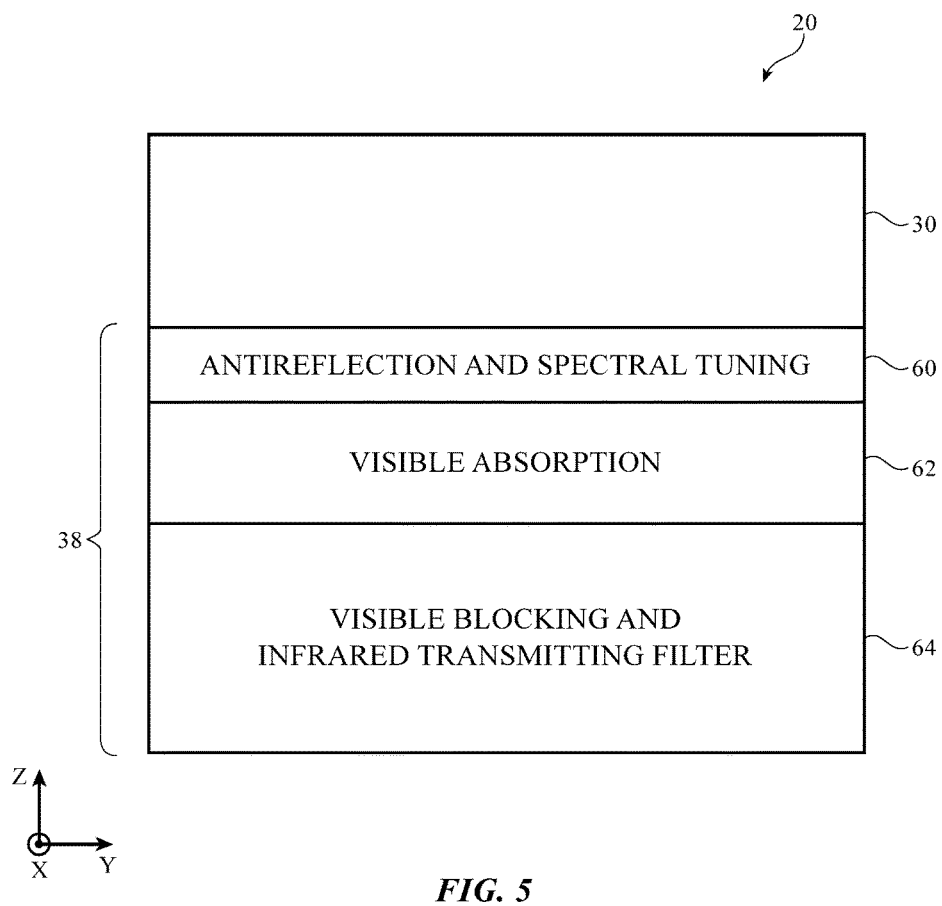
FIGS. 5 and 6 are cross-sectional side views of illustrative window coatings in accordance with embodiments.

An illustrative configuration for coating 38 is shown in FIG. 5. As shown in FIG. 5, coating 38 may be formed on the inner surface of display cover layer 30 and may include layers such as antireflection and spectral tuning layer 60, visible absorption layer 62, and visible light blocking and infrared light transmitting filter layer 64. Layers such as layers 60, 62, and 64 may be formed from individual thin-film layers and/or from stacks of multiple thin-film layers. Sublayers of material from layers 60, 62, and 64 may also be intermingled with each other. For example, one or more layers of the material that absorbs visible light in visible absorption layer 62 may be intermingled with the thin-film layers in the stack of layers forming layer 60, thereby forming an antireflection, spectral tuning, and visible light absorbing layer such as layer 66 of FIG. 6.

Figure 6:
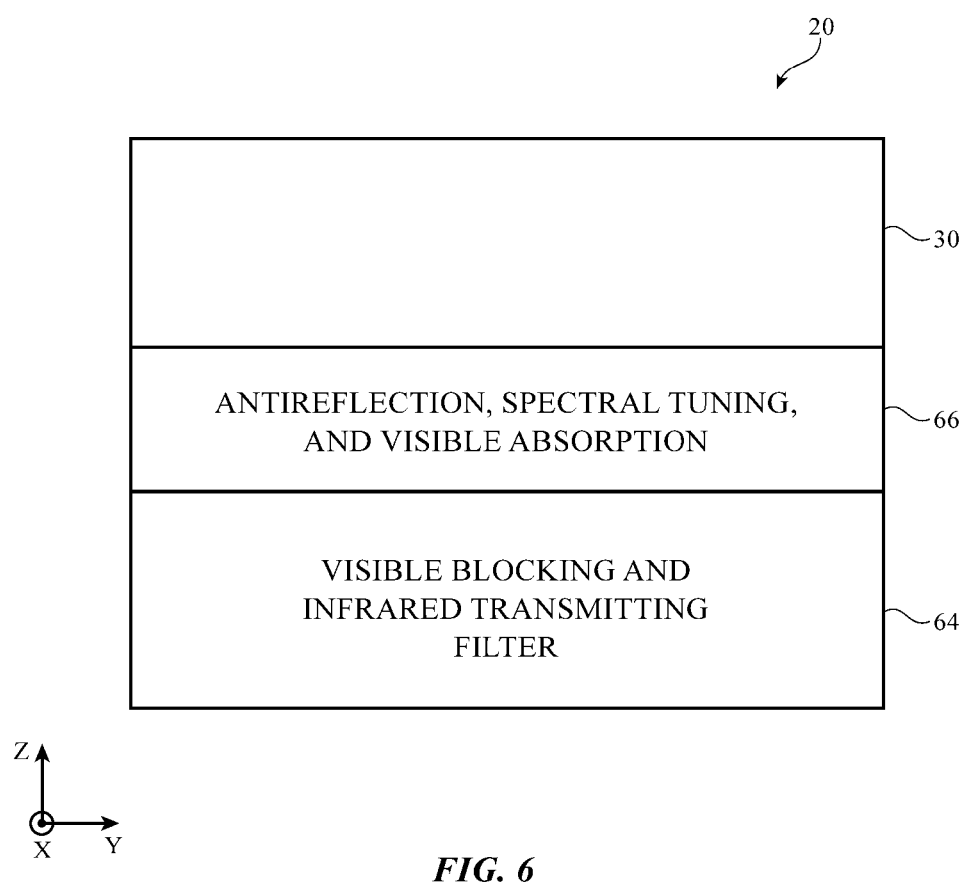

As the examples of FIGS. 5 and 6 demonstrate, coating 38 may contain antireflection structures. Materials such as black ink for opaque masking layer 36 may be formed from polymer containing particles of carbon black or other ink materials that have relatively low reflectivity. Accordingly, one or more dielectric layers or other thin-film layers may be formed in a stack to serve as an antireflection coating. The index of refraction of the one or more layers of antireflection material may be selected to reduce the light reflection from window 20 to a level that matches the light reflection from opaque masking layer 36 at visible light wavelengths.

If desired, the indexes of refraction, materials, and layer thicknesses of the materials in coating 38 (e.g., the spectral tuning structures of layer 60 of FIG. 5 and the spectral tuning structures of layer 66 in FIG. 6) may be selected to ensure that coating 38 has a desired color (e.g. a bluish black, or a color with another desirable spectral profile). Because thin-film interference effects can be used to adjust reflectivity and color, a wide variety of desired reflectivity values and colors can be implemented (e.g., by adjusting layer thicknesses, number of layers, and layer materials).

Visible light absorption layer 62 may contain materials that absorb visible light while passing infrared light (e.g., materials that exhibit visible light absorption and infrared light transmission in bulk form). As an example, visible light absorption layer 62 may be formed from a semiconductor. The semiconductor may have a bandgap that coincides with the edge of the visible light spectrum. With one suitable arrangement, visible light absorption layer 62 is formed from copper oxide (bandgap 2.1 eV), which absorbs visible light and transmits infrared light (e.g., light above about 700 nm).

Filter layer 64 may be formed from a thin-film filter stack that includes layers of materials (e.g., inorganic dielectric layers) of alternating higher and lower indices of refraction or other suitable layers. The indices of refraction, layer thicknesses, and materials used in forming thin-film filter layer 64 may be selected to form an infrared pass filter (i.e., a filter that blocks visible light and that passes infrared light above wavelengths of about 780 nm or other suitable wavelength).

Three illustrative configurations—P1, P2, and P3—for coating 38 are shown in FIGS. 7, 8, and 9, respectively.

In the example of FIG. 7, coating 38 has configuration P1. In this configuration, layer 60 has three dielectric layers: two layers of silicon nitride and an interposed layer of silicon oxide. The different index of refraction values for silicon nitride (index 2.0) and silicon oxide (index 1.45) relative to each other and relative to the glass (index 1.55) of layer 30 allow layers 60 to serve as an antireflection layer (reducing reflections of visible light from window 20) and as a color adjustment (spectral adjustment) layer for window 20. Visible light absorption layer 62 has been formed from a layer of copper oxide, which absorbs visible light and passes infrared light due to its bulk optical properties. Infrared pass filter layer 64 has been formed from a set of ten alternating silicon nitride and silicon oxide layers that form a thin-film interference filter blocking visible and passing infrared light.

In the example of FIG. 8, coating 38 has configuration P2. In this configuration, layer 60 has been formed from six alternating layers of silicon nitride and silicon oxide. Visible light absorption layer 62 has been formed from a layer of copper oxide. Infrared pass filter layer 64 has been formed from a set of ten alternating silicon nitride and silicon oxide layers.

In the example of FIG. 9, coating 38 has configuration P3. In this configuration, three layers of visible-light absorbing material (i.e., copper oxide, refractive index 2.6) have been interleaved with two layers of silicon oxide to form layer 66. The five-layer stack of layer 66 serves to absorb visible light (due to the visible light absorbing properties of copper oxide). This stack also serves as a thin-film filter forming a color adjustment layer that adjusts the spectral appearance of window 20 and a thin-film filter structure that forms an antireflection layer (due to the indices of refraction of the layers making up layer 60 and layer 30 and the thicknesses of the layers in layer 60). Infrared pass filter layer 64 has been formed from a set of ten alternating silicon nitride and silicon oxide layers.

Figure 10:
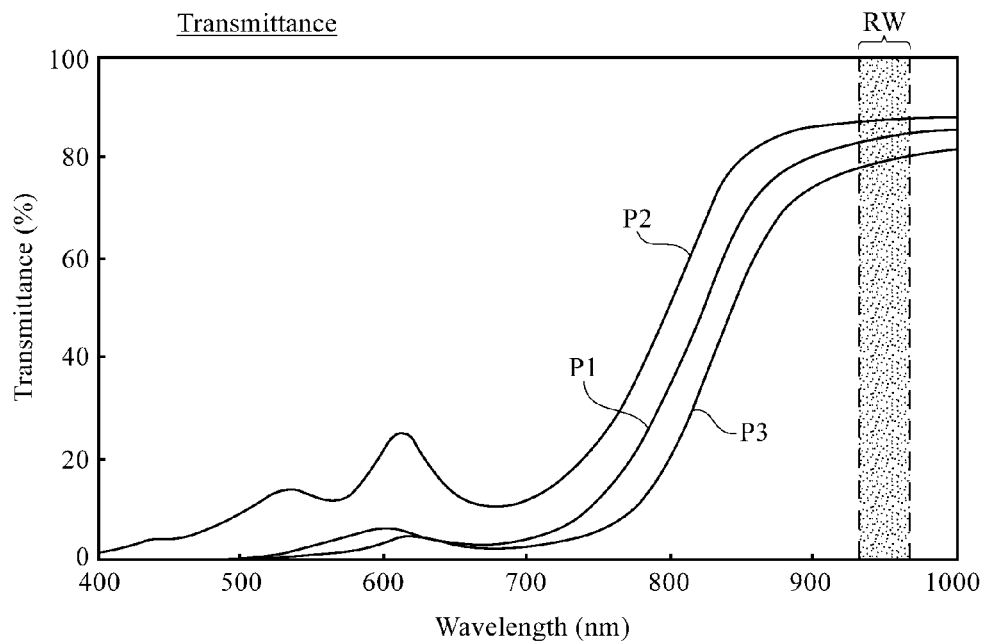
FIGS. 10 and 11 are graphs in which transmittance and reflectance have been respectively plotted as a function of wavelength for illustrative coatings in accordance with embodiments.
Figure 11:
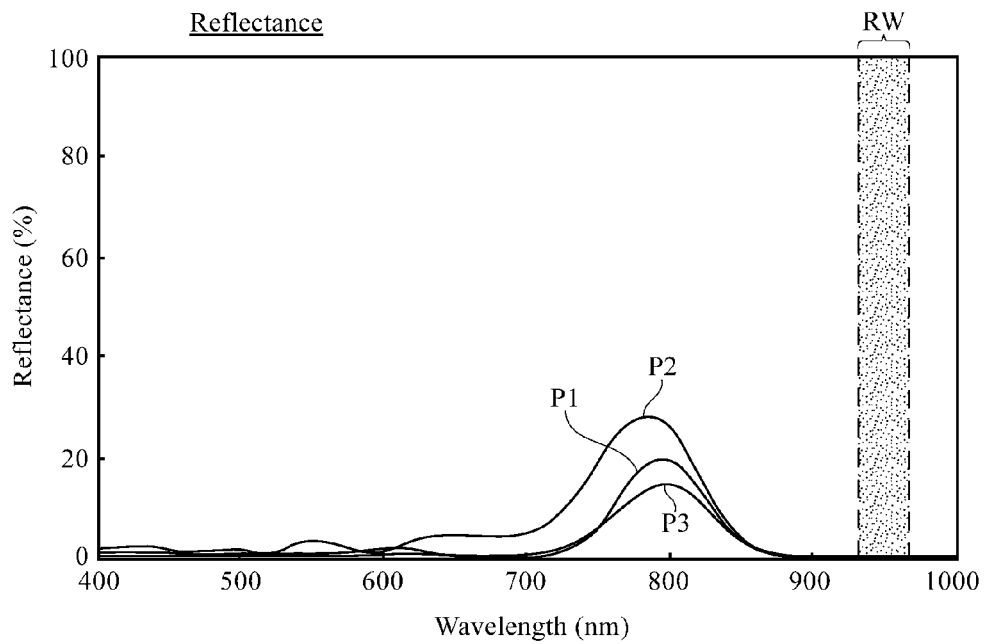

FIG. 10 is a graph in which light transmittance through coating 38 has been plotted as a function of wavelength for illustrative configurations P1, P2, and P3. FIG. 11 is a graph in which the reflectance of coating 38 has been plotted as a function of wavelength for illustrative configurations P1, P2, and P3. As the graphs of FIGS. 11 and 12 demonstrate, coating 38 may exhibit low reflectance, high visible light blocking, and high infrared light transmission (e.g., in infrared proximity sensor operating range RW).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing;
   a transparent member in the housing;
   an infrared-light-based component in the housing; and
   a window in the transparent member that is aligned with the infrared-light-based component, wherein the window includes a coating, wherein the coating includes a visible light absorbing layer having a material that absorbs visible light and passes infrared light, wherein the coating includes an infrared-light-transmitting filter that blocks visible light, and wherein the visible light absorbing layer is interposed between the infrared-light-transmitting filter and the transparent member.

2. The electronic device defined in claim 1 wherein the infrared-light-based component comprises an infrared proximity sensor.

3. The electronic device defined in claim 2 further comprising an opaque masking layer having an opening aligned with the window.

4. The electronic device defined in claim 3 further comprising a display in the housing, wherein the transparent member comprises a display cover layer for the display.

5. The electronic device defined in claim 4, wherein the display cover layer has a surface, wherein the opaque masking layer comprises black ink on the surface, and wherein the black ink is interposed between the coating and the display cover layer.

6. The electronic device defined in claim 4, wherein the display cover layer has a surface, wherein the coating is formed on the surface, wherein the opaque masking layer comprises black ink, and wherein the coating is interposed between the black ink and the display cover layer.

7. The electronic device defined in claim 1 wherein the transparent member comprises a display cover layer and wherein the visible light absorbing layer is interposed between the infrared-light-transmitting filter and the display cover layer.

8. The electronic device defined in claim 7 wherein the infrared-light-transmitting filter comprises a thin-film filter having multiple dielectric layers.

9. The electronic device defined in claim 8 wherein the multiple dielectric layers are inorganic dielectric layers.

10. The electronic device defined in claim 9 wherein the visible light absorbing layer comprises at least one semiconductor layer.

11. The electronic device defined in claim 10 wherein the semiconductor layer comprises copper oxide.

12. The electronic device defined in claim 7 further comprising a thin-film filter layer having multiple dielectric layers that serves as an antireflection and color adjustment layer and wherein the thin-film filter layer is interposed between the visible light absorbing layer and the display cover layer.

13. An electronic device, comprising:
    a housing;
    a display in the housing that has a display cover layer;
    an infrared-light-based component; and
    a window in the display cover layer that is aligned with the infrared-light-based component, wherein the window includes a coating, wherein the coating includes a thin-film dielectric stack that forms an infrared transmitting filter that blocks visible light.

14. The electronic device defined in claim 13 wherein the coating includes a layer between the thin-film dielectric stack and the display cover layer.

15. The electronic device defined in claim 14 wherein the layer between the thin-film dielectric stack and the display cover layer includes a material that absorbs visible light and that passes infrared light.

16. The electronic device defined in claim 15 wherein the material comprises a semiconductor.

17. The electronic device defined in claim 16 wherein the material comprises copper oxide.

18. The electronic device defined in claim 16 wherein multiple thin-film layers of the material are interleaved with multiple dielectric layers so that the layer that is between the thin-film dielectric stack and the display cover layer serves as an antireflection, spectral tuning, and visual absorption layer.

19. An electronic device, comprising:
a display having a display cover layer;
a window in the display cover layer that blocks visible light and transmits infrared light; and
an infrared light proximity sensor aligned with the window, wherein the window includes a coating having a visible-light-blocking and infrared-light-transmitting thin-film filter formed from multiple inorganic dielectric layers.

20. The electronic device defined in claim 19 wherein the coating includes at least one layer of inorganic material that absorbs visible light and that transmits infrared light and that is interposed between the visible-light-blocking and infrared-light-transmitting thin-film filter and the display cover layer.

21. The electronic device defined in claim 20 wherein the layer of inorganic material that absorbs visible light comprises a semiconductor layer.

22. An electronic device, comprising:
a housing;
a transparent member in the housing;
an infrared proximity sensor in the housing; and
a window in the transparent member that is aligned with the infrared proximity sensor; and
an opaque masking layer having an opening aligned with the window, wherein the window includes a coating, wherein the coating has a layer that does not reflect visible light and passes infrared light, and wherein the coating includes an infrared-light-transmitting filter that blocks visible light.

23. The electronic device defined in claim 22 wherein the coating scatters less than 5% of the visible light and the infrared light incident on the coating.

* * * * *